(12) United States Patent
Tomita et al.

(10) Patent No.: US 7,094,630 B2
(45) Date of Patent: Aug. 22, 2006

(54) METHOD OF FABRICATING SEMICONDUCTOR DEVICE HAVING A CHIP, REINFORCING PLATE, AND SEALING MATERIAL SHARING A COMMON REAR SURFACE

(75) Inventors: Yoshihiro Tomita, Tokyo (JP); Shinji Baba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 51 days.

(21) Appl. No.: 11/024,459

(22) Filed: Dec. 30, 2004

(65) Prior Publication Data

US 2005/0104202 A1    May 19, 2005

Related U.S. Application Data

(63) Continuation of application No. 10/252,710, filed on Sep. 24, 2002, now abandoned, which is a continuation of application No. 09/521,468, filed on Mar. 8, 2000, now Pat. No. 6,459,152.

(30) Foreign Application Priority Data

Oct. 27, 1999    (JP) ............................ 11-305368

(51) Int. Cl.
H01L 21/48    (2006.01)
H01L 23/48    (2006.01)

(52) U.S. Cl. .................. 438/108; 438/126; 438/459; 257/738

(58) Field of Classification Search ............... None
See application file for complete search history.

(56) References Cited

U.S. PATENT DOCUMENTS

| | | | |
|---|---|---|---|
| 5,450,283 A | 9/1995 | Lin et al. | 361/704 |
| 5,963,430 A | 10/1999 | Londa | 361/790 |
| 5,969,426 A | 10/1999 | Baba et al. | 257/778 |
| 6,031,284 A | 2/2000 | Song | 257/701 |
| 6,046,077 A | 4/2000 | Baba | 438/127 |
| 6,071,755 A | 6/2000 | Baba et al. | 438/106 |
| 6,081,037 A | 6/2000 | Lee et al. | 257/778 |
| 6,140,707 A | 10/2000 | Plepys et al. | 257/778 |
| 6,188,127 B1 | 2/2001 | Senba et al. | 257/686 |
| 6,221,693 B1 | 4/2001 | Ho | 438/108 |
| 6,287,890 B1 | 9/2001 | Ho | 438/106 |
| 6,313,522 B1 | 11/2001 | Akram et al. | 257/686 |
| 6,459,152 B1 | 10/2002 | Tomita et al. | 257/738 |
| 6,548,330 B1 | 4/2003 | Murayama et al. | 438/127 |
| 2002/0159242 A1 | 10/2002 | Nakatani et al. | 361/760 |

FOREIGN PATENT DOCUMENTS

| | | |
|---|---|---|
| JP | 61-2331 | 1/1986 |
| JP | 02-31437 | 2/1990 |
| JP | 06-283561 | 10/1994 |
| JP | 09-51015 | 2/1997 |
| JP | 10-135245 | 5/1998 |
| JP | 10-135254 | 5/1998 |
| JP | 11-186330 | 7/1999 |
| JP | 2001-168269 | 6/2001 |
| JP | 2001-267470 | 9/2001 |
| JP | 2001-144218 | 5/2002 |
| WO | WO 99/09592 | 2/1999 |

*Primary Examiner*—Alonzo Chambliss
(74) *Attorney, Agent, or Firm*—McDermott Will & Emery LLP

(57) ABSTRACT

A plurality of chips are mounted on a substrate, coupling portions between the chips and the substrate are sealed, the chips have rear surfaces thereof collectively polished, and the substrate with the chips thereon are separated into independent semiconductor devices.

2 Claims, 6 Drawing Sheets

F I G. 1
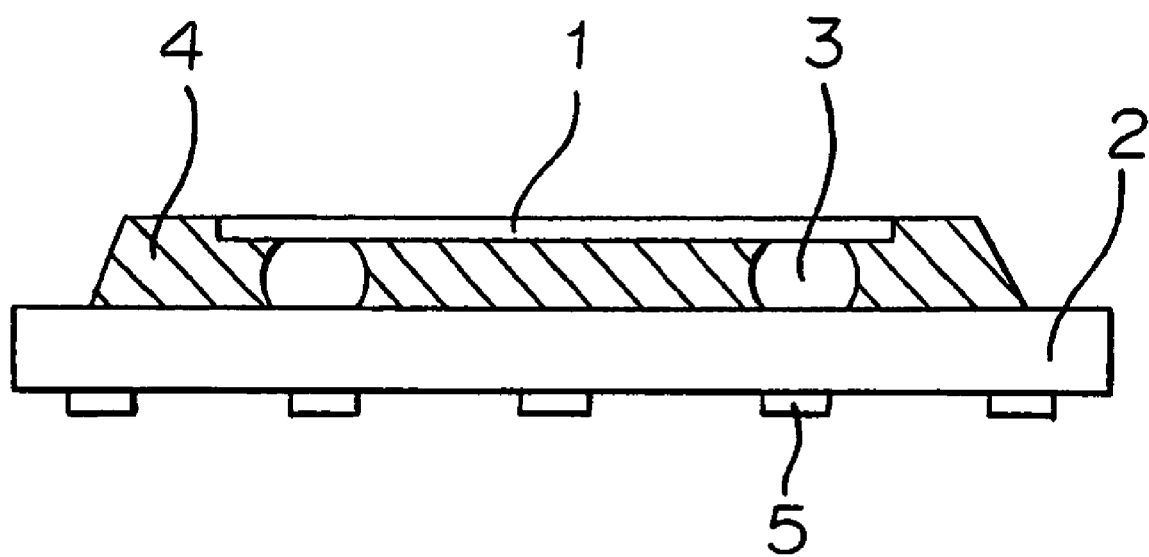

F I G. 3
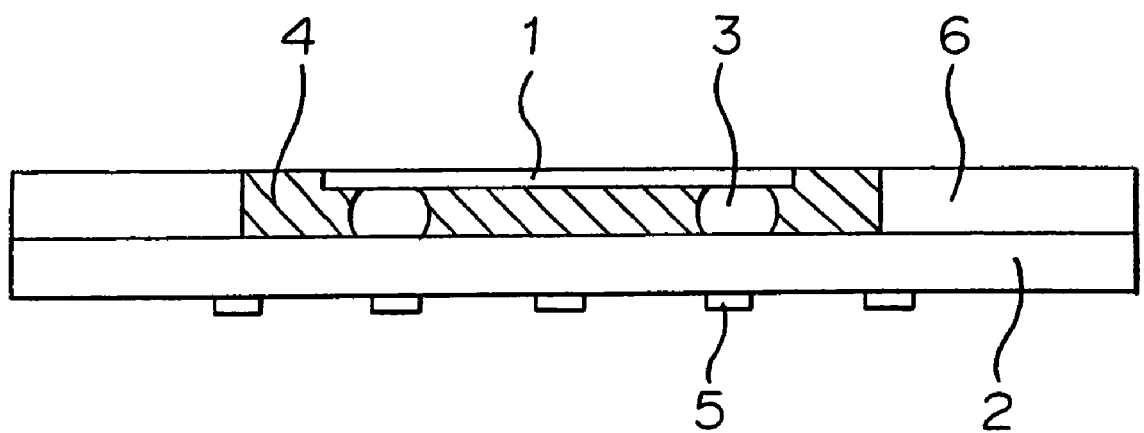

METHOD OF FABRICATING SEMICONDUCTOR DEVICE HAVING A CHIP, REINFORCING PLATE, AND SEALING MATERIAL SHARING A COMMON REAR SURFACE

This application is a continuation of application Ser. No. 10/252,710 filed Sep. 24, 2002, now abandoned which is a continuation of application Ser. No. 09/521,468 filed Mar. 8, 2000 and is now U.S. Pat. No. 6,459,152.

BACKGROUND OF THE INVENTION

1. Field of the Invention

The present invention relates to a semiconductor device which has a thin semiconductor element mounted thereon.

2. Discussion of Background

When, in particular, a thin semiconductor element (having a thickness not greater than 0.1 mm for instance) is mounted on a conventional semiconductor device, a wafer is preliminarily ground to a thin one, the wafer is separated into independent chips by dicing, and the independent chips are mounted on substrates or lead frames in a usual method.

The usual method has created a problem in that a chip is likely to be fractured in handling, or that when a chip is mounted on a substrate, a stress is generated by bonding electrode portions to damage a coupling portion or the semiconductor element.

SUMMARY OF THE INVENTION

It is an object of the present invention to solve the problem, and provides a semiconductor device having a thin semiconductor element mounted thereon, the semiconductor element being obtained by mounting a plurality of chips on a substrate before thinning the thickness of the chips, and polishing rear surfaces of the chips with coupling portions protected by sealing after, e.g. testing or repairing or with a stress to the chips lessened.

According to a first aspect of the present invention, there is provided semiconductor device having a thin semiconductor element mounted thereon, the semiconductor element being obtained by mounting a plurality of semiconductor elements on a substrate, polishing rear surfaces of the semiconductor elements after sealing coupling portions, and separating the substrate with the semiconductor elements thereon into independent semiconductor devices.

According to a second aspect of the present invention, a reinforcing plate is fixed on the substrate, and the substrate with the semiconductor elements thereon are separated into the independent semiconductor devices after assembly.

According to a third aspect of the present invention, a reinforcing plate is fixed on the substrate, the reinforcing plate comprising a metallic plate and a wiring plate in layered fashion, and conduction is made between the wiring plate and wiring on the substrate.

According to a fourth aspect of the present invention, there is provided a semiconductor device having thin semiconductors element mounted thereon, the semiconductor elements being obtained by mounting a plurality of semiconductor elements, sealing the semiconductor elements, providing a laminate on rear surfaces of the semiconductor elements to form a wiring layer with the semiconductor elements included therein after polishing the rear surfaces of the semiconductor elements, and wiring, followed by repeating the same step.

The present invention is constructed as stated earlier, offering the following advantages.

In accordance with the first aspect, the plural semiconductor elements are mounted on a substrate, and the rear surfaces of the semiconductor elements are polished after sealing. As a result, the semiconductor elements can be made thin without damaging the semiconductor elements.

In accordance with the second aspect, the reinforcing plate is fixed on the substrate. Even if the substrate has low rigidity, the substrate can ensure required flatness, allowing polishing of the rear surfaces to be carried out with good precision.

In accordance with the third aspect, the reinforcing plate is fixed on the substrate, and conduction is made between the wiring plate and the wiring on the substrate. Thus, the semiconductor device can improve a wiring allowance for the substrate, can have a thin semiconductor element mounted thereon, and the semiconductor element can be made smaller.

In accordance with the fourth aspect, semiconductor elements are mounted, the semiconductor elements are sealed, a wiring layer is provided by laminating after polishing rear surfaces of the semiconductor elements, and followed by the repeating the same step. This arrangement can provide a semiconductor device with a plurality of chips mounted thereon in high density.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional side view showing the semiconductor device according to a first embodiment of the present invention;

FIG. 3 is a cross-sectional side view showing the semiconductor device according to a second embodiment of the present invention;

DESCRIPTION OF THE PREFERRED EMBODIMENTS

Figure 2:
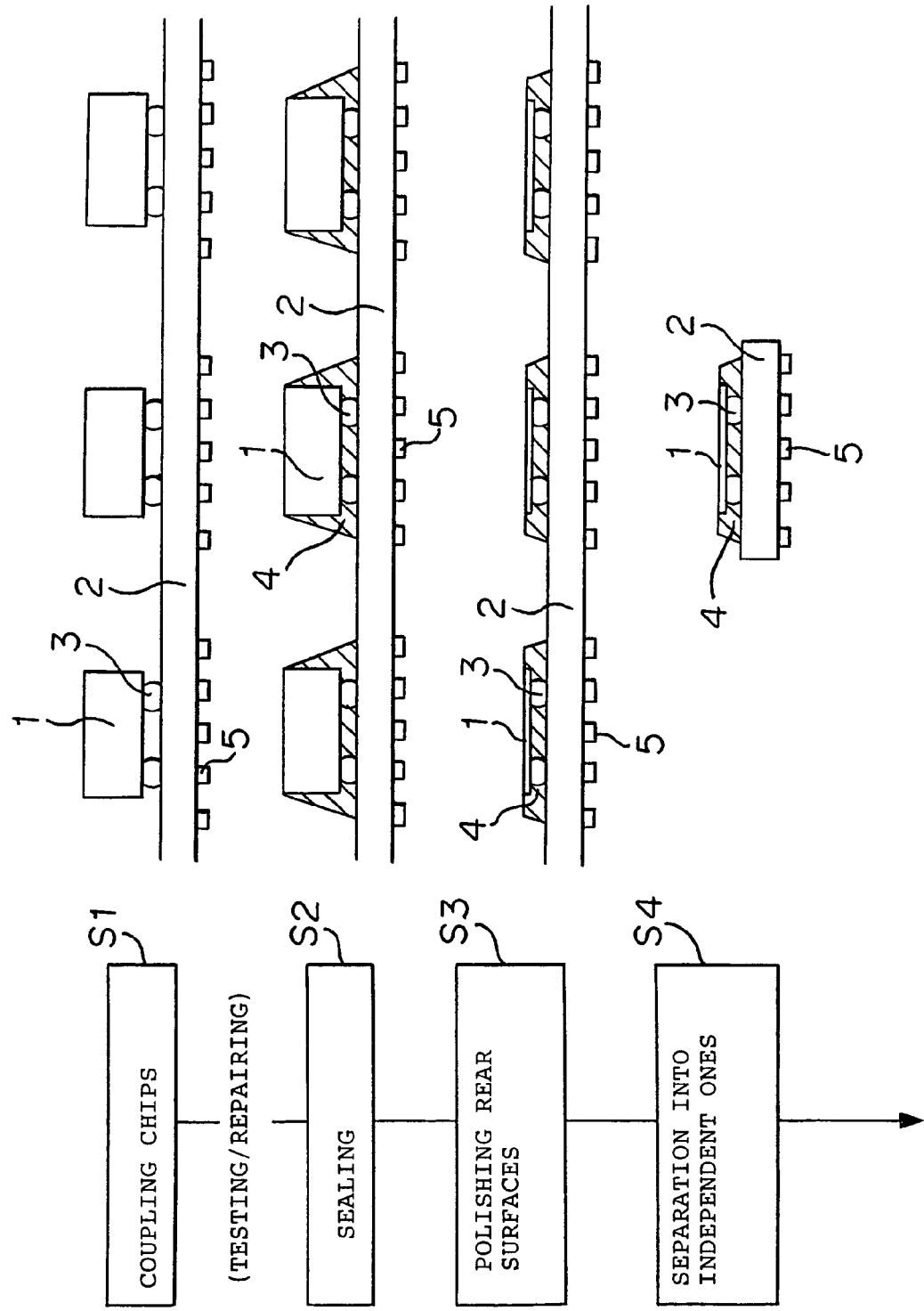
FIG. 2 is a fabrication flowchart for preparing the semiconductor device according to the first embodiment.

Now, preferred embodiments of the present invention will be described in detail, referring to FIGS. 1 through 7.

Embodiment 1

In FIG. 1 is shown a cross-sectional side view of the semiconductor device according to a first embodiment of the present invention. In FIG. 1, reference numeral 1 designates a thin chip as a semiconductor element, which has been polished thin, reference numeral 2 designates a substrate, reference numeral 3 designates a bump, which couples the thin chip 1 and the substrate 2, reference numeral 4 designates a sealing resin, and reference numeral 5 designates an external terminal provided on the substrate 2.

In FIG. 2 is shown an example of the fabrication flowchart for preparing the semiconductor device shown in FIG. 1. As shown in FIG. 2, a plurality of chips 1 are mounted on the substrate 2 (Step S1), coupling portions between the substrate 2 and the chips 1 are sealed (Step S2), and then the chips 1 have rear surfaces thereof collectively ground (Step S3), and the substrate with the chips thereon is separated into independent semiconductor devices (Step S4).

As explained, in accordance with the semiconductor device and the fabrication method of the first embodiment, the rear surfaces of the chips 1 can be ground thin without damaging the chips 1 or the bumps 3 as the coupling portions. The collective grinding of the rear surfaces can increase productivity.

Embodiment 2

In FIG. 3 is shown a cross-sectional side view of the semiconductor device according to a second embodiment of the present invention. In FIG. 3, reference numeral 6 designates a reinforcing plate, which is fixed on the substrate 2. The other elements are the same as those of the first embodiment.

Figure 4:
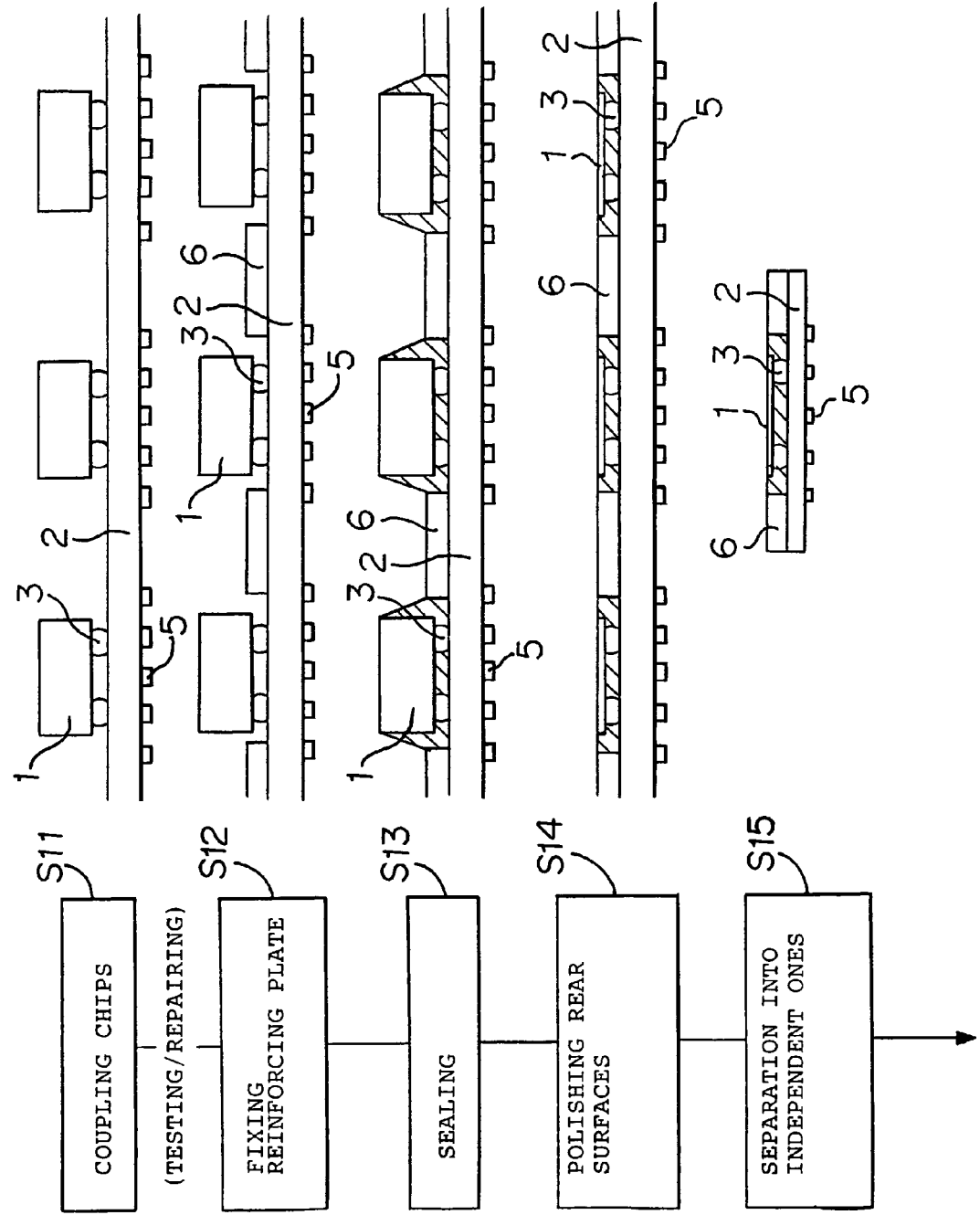
FIG. 4 is a fabrication flowchart for preparing the semiconductor device according to the second embodiment.

In FIG. 4 is shown an example of the fabrication flowchart for preparing the semiconductor device according to the second embodiment. As shown in FIG. 4, a plurality of chips 1 are mounted on the substrate 2, (Step S11), reinforcing plates are fixed on the substrate (Step S12), the coupling portions between the chips 1 and the substrate 2 are sealed (Step S13), the chips 1 have rear surfaces thereof polished (Step S14), and then the substrate 2 with the chips thereon are separated into independent semiconductor devices (Step S15).

As explained, the semiconductor device and the fabrication method according to the second embodiment can ensure the flatness of the substrate and polish the rear surfaces of the chips with good precision even if the substrate has low rigidity.

Embodiment 3

Figure 5:
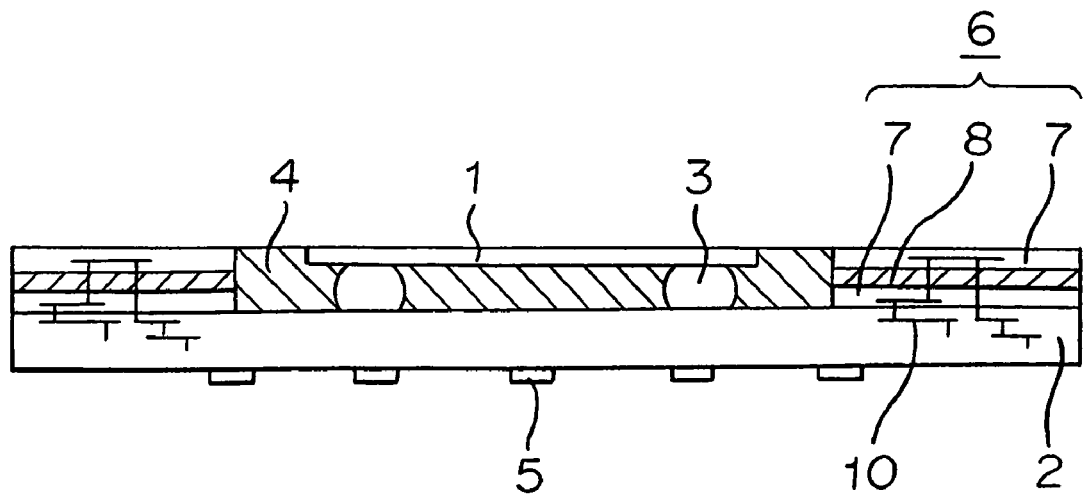
FIG. 5 is a cross-sectional side view showing the semiconductor device according to a third embodiment of the present invention.

In FIG. 5 is shown a cross-sectional side view of the semiconductor device according to a third embodiment of the present invention. In FIG. 5, reference numeral 6 designates a reinforcing plate, which comprises a metallic plate 8 and wiring plates 7 in three-layered fashion. Reference numeral 10 designates a wire for electrical conduction between the reinforcing plate 6 and the substrate 2. Although the reinforcing plate 6 has such a three-layered structure of the wiring plate 7/the metallic plate 8/the wiring plate 7 in the third embodiment, the layered structure or the order of the plates in the layered structure is not limited to the shown fashion.

As explained, the semiconductor device according to the third embodiment can improve the wiring allowance for the substrate and can have thin semiconductor elements mounted thereon in a smaller size.

Embodiment 4

Figure 6:
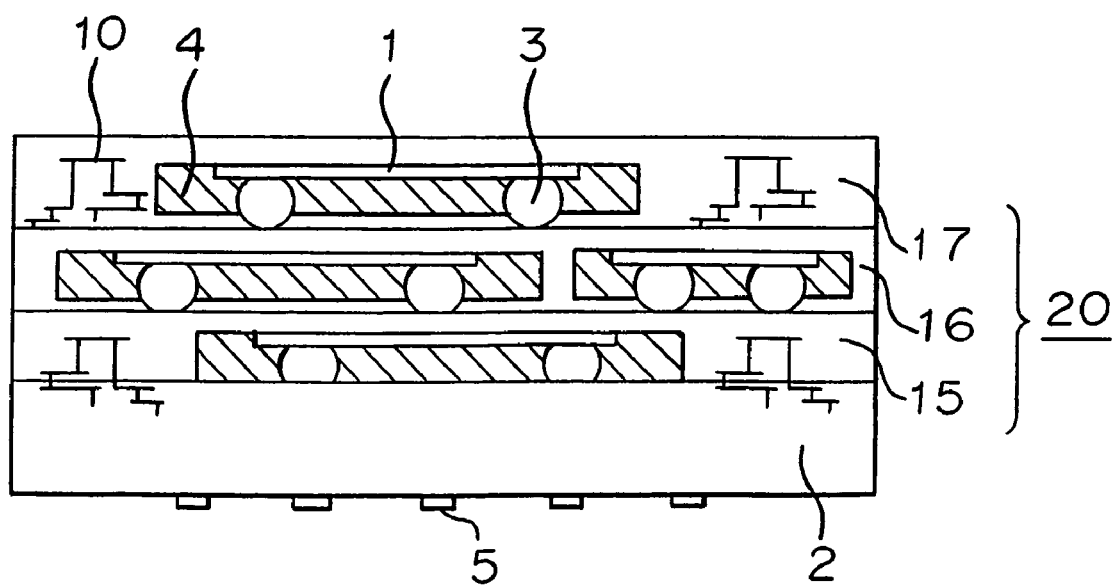
FIG. 6 is a cross-sectional view showing the semiconductor device according to a fourth embodiment of the present invention.

In FIG. 6 is shown a cross-sectional side view of the semiconductor device according to a fourth embodiment of the present invention. In FIG. 6, reference numeral 20 designates a wiring layer, which is layered on the substrate 2, and which include chips 1 in plural sublayers. Reference numerals 15, 16 and 17 designate the respective wiring sublayers.

Figure 7:
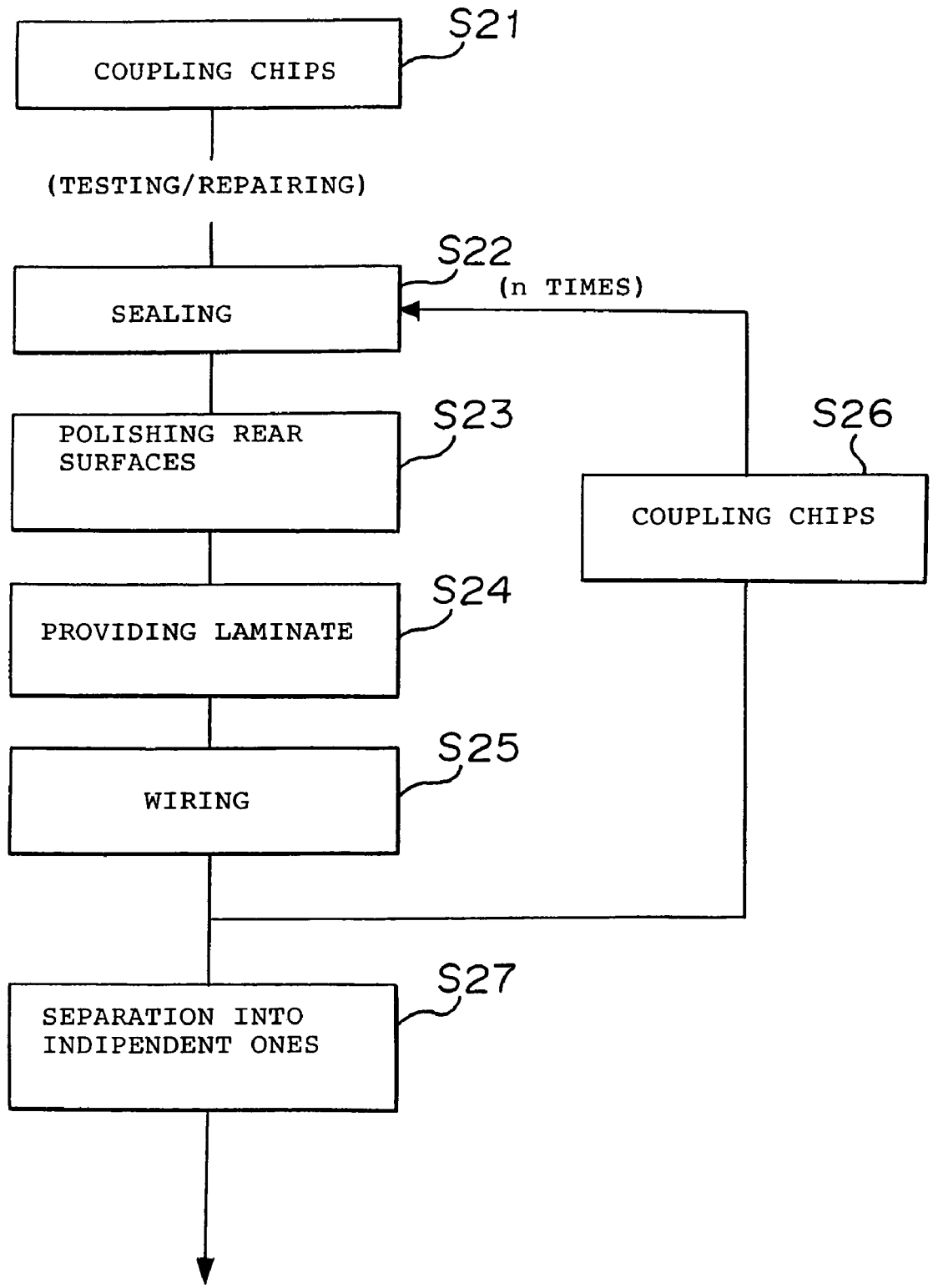
FIG. 7 is a fabrication flowchart for preparing the semiconductor device according to the fourth embodiment.

In FIG. 7 is shown an example of the fabrication flowchart for preparing the semiconductor device according to the fourth embodiment. The wiring layer 20 shown in FIG. 6 is prepared by coupling chips 1 (Steps S21 and S26), sealing (Step S22), polishing the rear surfaces of the chips (Step S23), providing a laminate on the rear surfaces (Step S24), and wiring (Step S25), repeating these steps, and finally separating the substrate with the wiring layer thereon into independent semiconductor devices as shown in the flowchart of FIG. 7.

As explained, the semiconductor device and the fabrication method according to the fourth embodiment can provide a semiconductor device with plural thin chips mounted thereon in high density.

What is claimed is:

1. A method of manufacturing semiconductor device, comprising the steps of:

providing a substrate having a semiconductor chip electrically connected thereon and a reinforcing plate arranged around the semiconductor chip, the semiconductor chip is electrically connected with the substrate through bump electrodes and having a gap between the substrate;

sealing the gap with a sealing resin; and after the sealing step, grinding the sealing resin and one surface of the semiconductor chip together so as to form a common ground rear surface shared by the sealing resin and the semiconductor chip, wherein the reinforcing plate is proximate two sides of the semiconductor element, and the two sides are separate from ground surface.

2. The method of manufacturing semiconductor device according to claim 1, wherein the reinforcing plate comprising a metallic plate and a wiring plate in layered fashion, and conduction made between the wiring plate and wiring on the substrate.

* * * * *